US005689472A

United States Patent [19]
Tanaka et al.

[11] Patent Number: 5,689,472
[45] Date of Patent: Nov. 18, 1997

[54] SYSTEM AND METHOD FOR PROVIDING EFFICIENT ACCESS TO A MEMORY BANK

[75] Inventors: Greg L. Tanaka, Sunnyvale; Sean H. Kuo, Saratoga, both of Calif.

[73] Assignee: Silicon Magic Corporation, Cupertino, Calif.

[21] Appl. No.: 739,868

[22] Filed: Oct. 31, 1996

[51] Int. Cl.$^6$ ............................................. G11C 7/00
[52] U.S. Cl. ....................... 365/230.02; 365/230.04; 365/230.06
[58] Field of Search ................... 365/230.02, 230.03, 365/230.04, 230.06, 189.02

[56] References Cited

U.S. PATENT DOCUMENTS

| | | | |
|---|---|---|---|
| 5,361,339 | 11/1994 | Nadakia et al. | 365/230.02 |
| 5,479,393 | 12/1995 | Yun et al. | 365/230.02 |

Primary Examiner—David C. Nelms
Assistant Examiner—Vu A. Le
Attorney, Agent, or Firm—Benman Collins & Sawyer

[57] ABSTRACT

Apparatus, method, and system aspects for providing efficient accesses to memory in a computer system, the computer system including a controller, are described. Included in the aspects are a random access memory array having a plurality of rows and columns and coupled to the controller, and a column selection mechanism coupled to the memory array and the controller with the column selection mechanism being divided into predetermined portions for providing column selection signals to access chosen portions of a row in the memory array. Further included as the column selection mechanism is a multiplexer. In one embodiment, the multiplexer is divided into halves and provides separate selection signals for accessing upper word halves and lower word halves of the random access memory.

22 Claims, 4 Drawing Sheets

SYSTEM AND METHOD FOR PROVIDING EFFICIENT ACCESS TO A MEMORY BANK

FIELD OF THE INVENTION

The present invention relates to accessing computer system memory and more particularly to providing efficient access to a memory bank.

BACKGROUND OF THE INVENTION

As central processing units for computer systems have undergone constant improvement, processing speeds for computer systems have continued to increase. With increased processing speeds remaining a valuable feature for computer systems, matching the improved processing speed in other computer system components has occasionally been problematic. Included in these components is the random access memory (RAM) for the computer system.

The speed with which writes to and reads from a computer system's RAM occur often determines how quickly data is processed. For computers with processors that outpace the memory, processing of data is hampered by the discrepancy. Changes in memory structures have been attempted to bridge the gap and provide more symmetry between system speed and memory speed. An example of an altered memory structure is extended-data-out (EDO) memory.

EDO memory, a form of dynamic-RAM (DRAM), attempts to speed accesses to consecutive locations in memory by assuming that the next memory access will target an address in the same transistor row as the previous access. Further, EDO memory latches data at the output, which allows data to be read even as the inputs are being changed for a next location. In general, EDO memory performs aligned accesses with each system clock.

While EDO memory structures do help memory speed more closely correspond with system speed, a gap still exists and hampers system efficiency. Improvements for reducing memory access time are especially desirable for data intensive operations, such as graphics processing. In particular, greater ability to achieve access in a single cycle to memory locations crossing word boundaries is highly desirable. Accordingly, a need exists for faster memory accesses, including random non-aligned memory accesses. The present invention address such a need.

SUMMARY OF THE INVENTION

The present invention addresses this need through apparatus, method, and system aspects for providing efficient access to a memory bank in a computer system, the computer system including a controller. Included in the aspects of the present invention are a random access memory array having a plurality of rows and columns and coupled to the controller, and a column selection mechanism coupled to the memory array and the controller, with the column selection mechanism being divided into predetermined portions for providing column selection signals to access chosen portions of a row in the memory array. Further included in the present invention as the column selection mechanism is a multiplexer. In one embodiment, the multiplexer is divided into halves and provides separate selection signals for accessing upper word halves and lower word halves of the random access memory.

Through the aspects of the present invention, a more flexible approach to accessing memory is achieved. The ability to access random portions of words in memory is of particular significance in graphics processing situations in which the memory is typically made wider to support greater bandwidth, but access to the data stored in the memory is required with much smaller granularity. Further, the present invention overcomes the limitations of poor efficiency that multiple cycle accessing for achieving multiple independent accesses to memory from a single row, including random, non-aligned accesses, produces. In addition, the present invention overcomes cost increases imposed by attempts to provide more elaborate memory structures to reduce cycle access time. These and other advantages of the aspects of the present invention will be more fully understood in conjunction with the following detailed description and accompanying drawings.

DETAILED DESCRIPTION

The present invention relates to efficient access to a memory bank in a computer system. The following description is presented to enable one of ordinary skill in the art to make and use the invention and is provided in the context of a patent application and its requirements. Various modifications to the preferred embodiment and the generic principles and features described herein will be readily apparent to those skilled in the art.

Figure 1A:
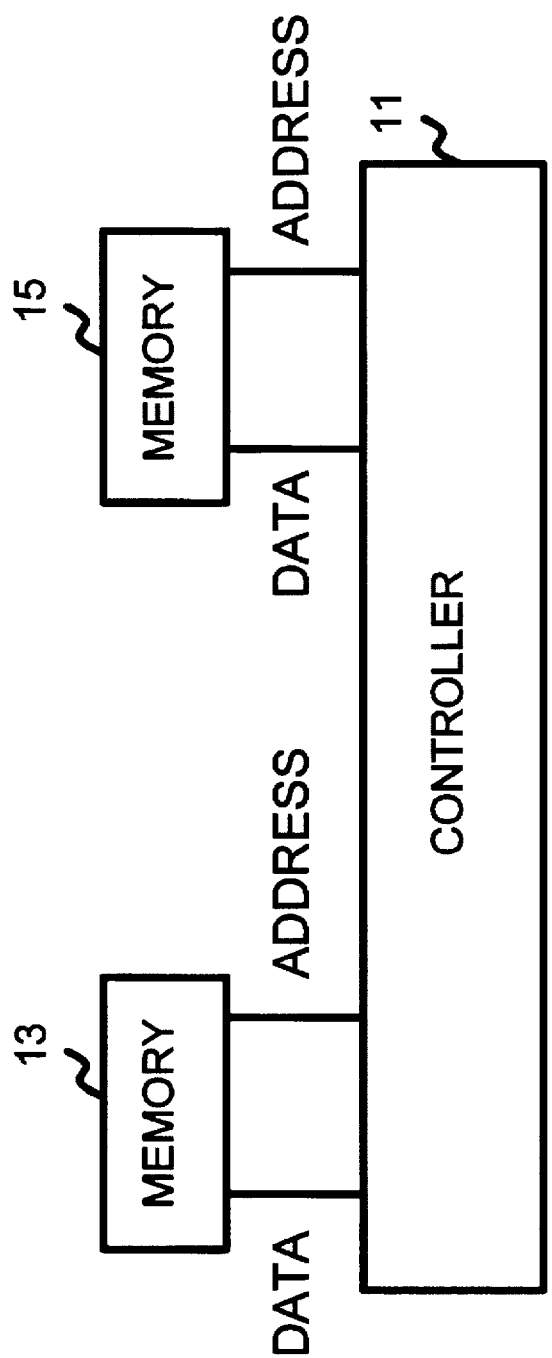
FIG. 1a illustrates a block diagram representation of a typical multiple memory array system.
Figure 1B:
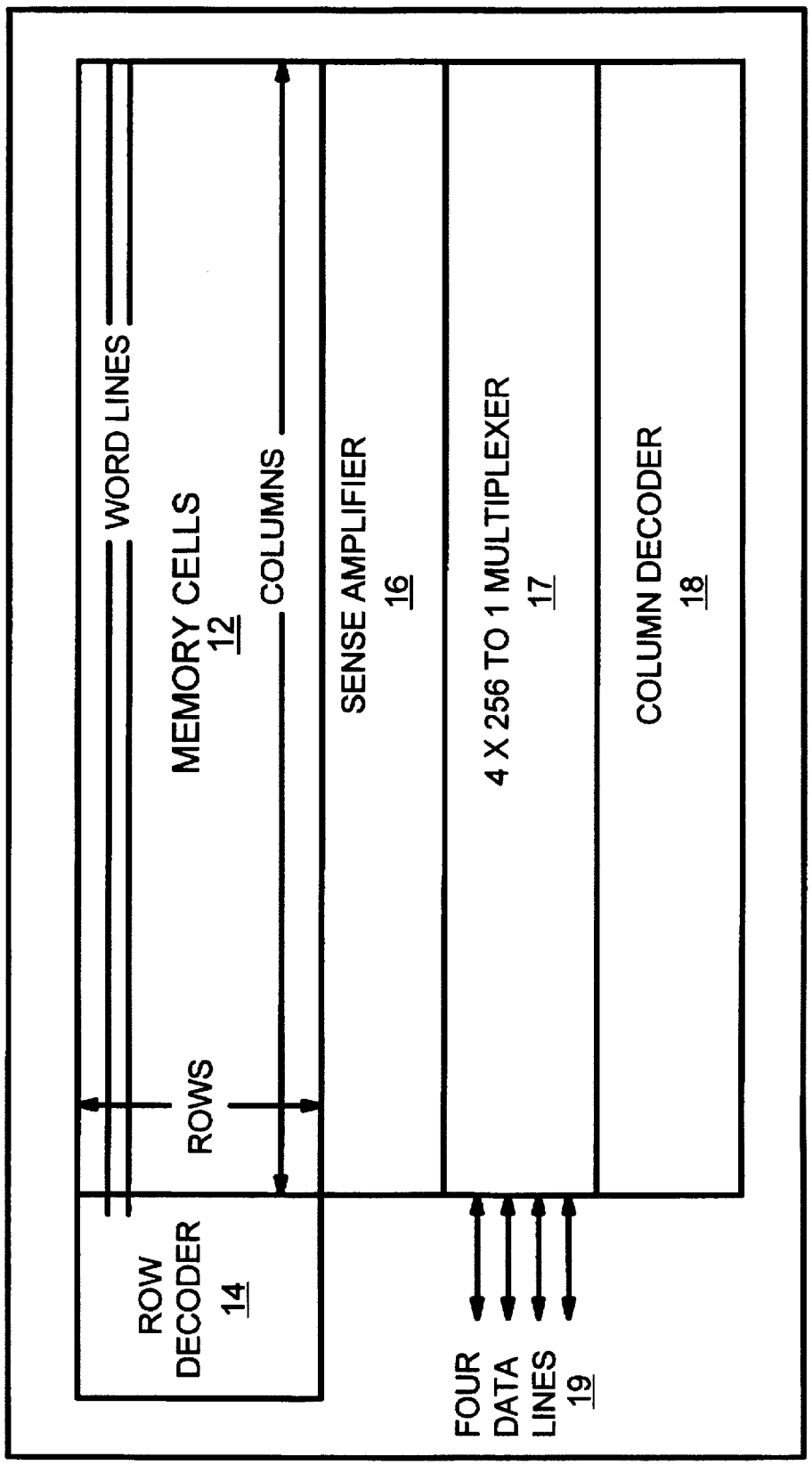
FIG. 1b illustrates a block diagram representation of a conventional memory block within a memory array system.

General attempts to provide efficient access to a memory bank, including multiple independent aligned accesses to memory from a single row, such as access to memory locations crossing word boundaries in a single cycle, have typically employed the use of two or more separate memory arrays. FIG. 1a illustrates a block diagram of a dual memory array structure. A controller 11 provides separate addresses to each of two memory arrays, 13 and 15. Each memory array 13, 15 typically comprises a plurality of memory blocks. FIG. 1b illustrates a block diagram of a typical DRAM block within array 13 or 15. Each DRAM block is typically comprised of a memory cell array 12 comprising rows and columns of memory cells, row decoder 14, sense amplifiers 16, multiplexer 17, column decoder 18, and data lines 19. Typical DRAMs have significantly more columns than rows in each block. By way of example, the DRAM block depicted in FIG. 1b has 256 rows and 1024 columns, with four data lines 19, the number of which can be varied, as the input/output lines for each block running parallel to the rows. The rows which are driven by circuitry outside the memory cell block are also referred to as word lines. The columns, along which data flows into and out of memory cells, are also referred to as bit lines.

In typical operation, when the data stored in one block of the DRAM is to be accessed, row decoder 14 activates one entire row of the 256 rows in the memory cell array 12. The data in the selected row of cells is transferred to the set of sense amplifiers 16, with the number of sense amplifiers typically the same as the number of columns. The secondary multiplexer 17 is then used to select a particular number of bits to be delivered over data lines 19, as determined from the 1024 bit column address delivered via the column decoder 18.

Referring again to FIG. 1a, the use of the separate memory arrays 13 and 15 allows the controller 11 to access separate portions of data, such as the upper and lower halves of a word. For an internal array, the number of channels usually needs to be doubled to support the dual separation. For an external array, the need for separate buses to support the separate arrays requires an increase in the number of pins and in the chip size. While possible, the multiple, separate array approach is neither practical nor cost-effective in achieving efficient access to a memory bank.

The present invention overcomes these limitations by providing a system for for multiple independent aligned access to a single row in memory, i.e., a bank of memory. Of course, references to multiple independent aligned accesses also refer to random, non-aligned accesses, since random, non-aligned accesses are a special form of the multiple independent accesses. It should also be appreciated that the following describes the present invention in terms of providing partial word access with access to an upper half and a lower half of a memory word. Of course, other partial word accesses to fractional portions of words, such as access to each quarter, each eighth, etc., of a word, are possible and may be achieved as desired through the implementation of the principles of the present invention. Accordingly, the following is to be considered descriptive and not restrictive of the present invention.

Figure 2:
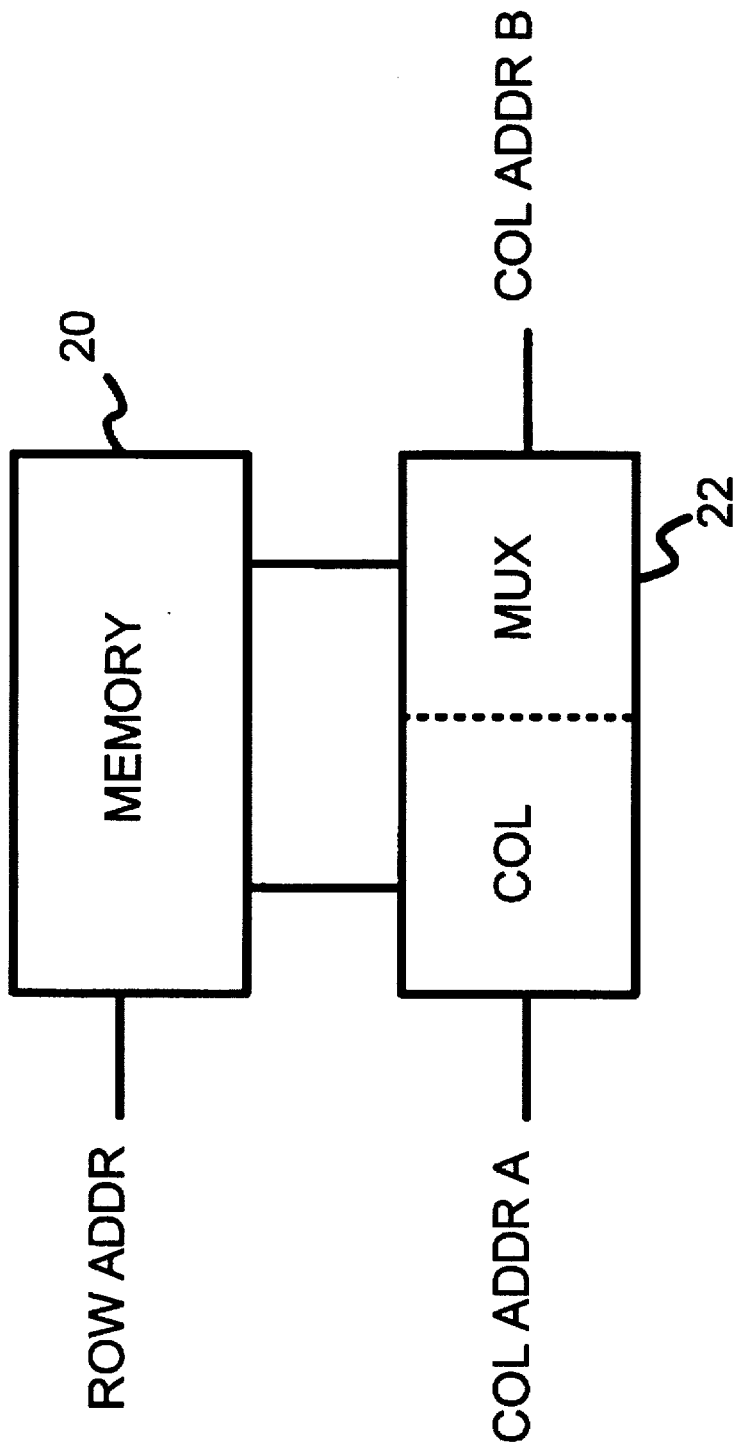
FIG. 2 illustrates a overall block diagram of a system for efficient access to a memory bank in accordance with the present invention.

FIG. 2 illustrates an overall block diagram of a system for achieving multiple independent aligned access in accordance with the present invention. A memory array 20, such as a DRAM, receives a row address (Row Addr) signal from a system controller (e.g., controller 11, FIG. 1a), decoded by a row decoder (e.g., row decoder 14, FIG. 1b), as is well known to those skilled in the art. A column selection mechanism 22, e.g., a multiplexer (Col MUX), such as an 8:1 MUX, is coupled to the memory 20. The Col MUX 22 is preferably split into portions, e.g., into two halves, to provide separate column addresses to the memory 20 to allow access to separate portions of the memory words, including those that cross word boundaries. Suitably, the Col MUX 22 receives separate signals, e.g., Col Addr$_A$ and Col Addr$_B$, from the system controller for selecting the column addresses in the memory 20.

Figure 3A:
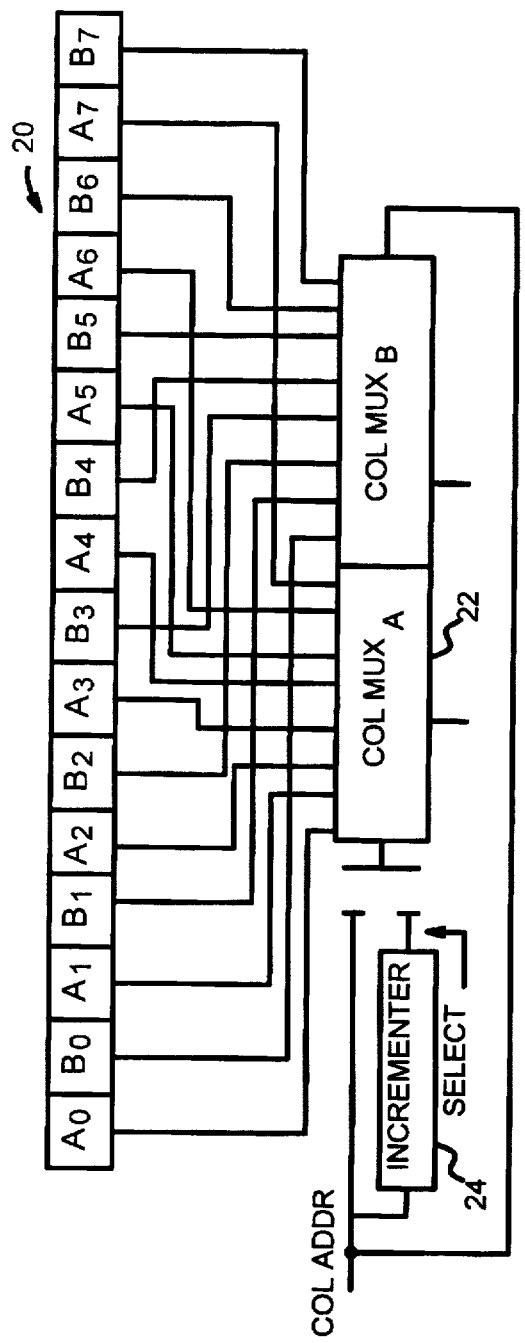
FIG. 3a illustrates a logical arrangement representation of a portion of FIG. 2 in greater detail.

FIG. 3a more particularly presents an example of a logical arrangement representation of the interaction between the memory 20 and Col MUX 22. In FIG. 3a, a single row of the memory 20, as selected via Row Addr, is suitably represented as a series of eight words, each word comprising an upper half, A, and a lower half, B. By way of example, each word is 64 bits, with each half comprising 32 bits. The Col MUX 22 is suitably split in half, e.g., Col MUX$_A$ and Col MUX$_B$, to provide separate selection of the upper and lower halves of each word. An incrementer 24, e.g., a three-bit adder, preferably is coupled to the Col MUX 22 to assist in the selection of separate word halves. A selection signal, e.g., Select, is suitably provided by the controller to select between the Col Addr and incremented Col Addr for output as the address for one portion of the Col MUX 22, e.g., the Col Addr$_A$ signal. For accesses to portions of the same word, the Col Addr signal is suitably selected to provide the same Col Addr signal to all of the portions of the Col MUX 22. Alternatively, the Col Addr signals for each portion of Col MUX 22 could be supplied separately to allow addressing independently to double the number of effective channels.

Figure 3B:
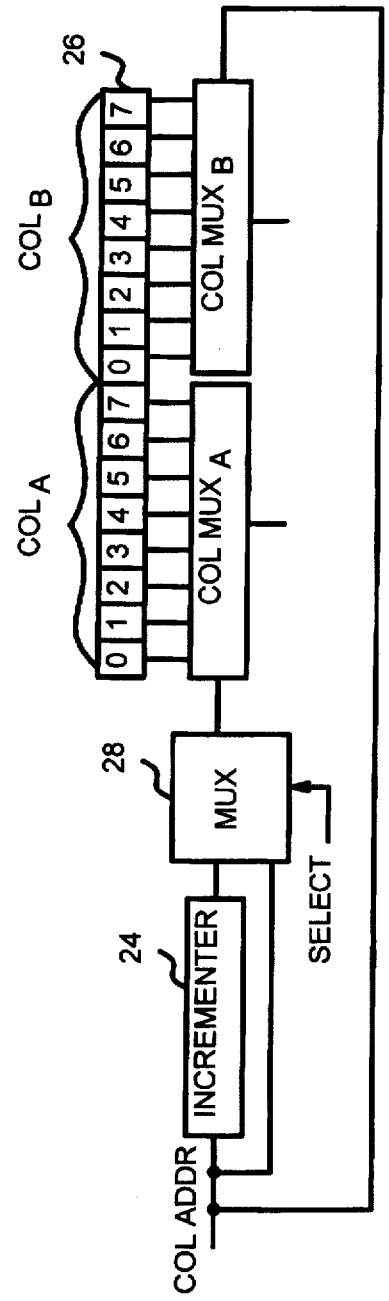
FIG. 3b illustrates a physical arrangement representation of a portion of FIG. 2 in greater detail.

While FIG. 3a effectively represents the logical arrangement in a preferred embodiment, FIG. 3b illustrates a physical arrangement of a preferred embodiment. Like components between FIG. 3a and FIG. 3b have been numbered similarly. As shown, physically, the memory columns, e.g., Col$_A$ and Col$_B$, are provided such that they lie in parallel to one another. Further, typically sense amplifiers 26 are coupled between the Col MUX 22 and the memory columns. In addition, the selection mechanism for utilizing the Select signal may be suitably implemented as a multiplexer 28.

As an example of operation in accordance with the present invention, an access for the upper half of word one, $A_1$, and the lower haft of word zero, $B_0$, could occur. Preferably, the Col Addr signal from the controller provides the column address for word zero. The incrementer 24 suitably increments the Col Addr signal to provide the column address for word one. In a preferred embodiment, for sequential accesses crossing a word boundary as in this example, the least significant bit (LSB) of the three bits sent to the incrementer 24 from the controller is suitably utilized as the Select signal to select whether the Col MUX$_A$ half of the Col MUX 22 receives the Col Addr signal or the incremented signal. Col MUX$_B$ suitably receives the Col Addr signal as the Col Addr$_B$ signal. Of course, in non-sequential random accesses, the controller suitably provides the Select signal for producing the multiple column address signals, e.g., Col Addr$_A$ and Col Addr$_B$, and thus allowing the independent selection of chosen portions of memory. Thus, the ability to provide separate selection signals for partial words via the Col MUX 22 capably produces efficient accesses to a bank of memory.

With the present invention, accesses to memory are improved by changing serialized access to parallel access. Further, speed is increased and power consumption is reduced by requiring only one access for non-aligned accesses. Those systems normally requiring two accesses to achieve non-aligned accesses typically require up to 50% more time for splitting the column MUX once as compared with the present invention to achieve the same results. For instances where the desired alignment is very small relative to the width of the memory bus, the conventional method to access the non-aligned word would typically require 100% more time. Alternatively, when multiple pieces of data are required from the same row, and the pieces of data are small relative to the size of the row, the savings is potentially unlimited, since the present invention advantageously allows the pieces of data to be fetched in parallel and independently. The significant time savings further bridges the gap between system and memory speeds without requiring larger memory or extensive complex re-design of the memory structure. Such savings are of particular benefit in data intensive operations, including graphics texturing, which commonly involve interpolating an average between pixel pairs stored in memory, and MPEG reconstruction processes.

Although the present invention has been described in accordance with the embodiments shown, one of ordinary skill in the art will recognize that there could be variations to the embodiment and those variations would be within the spirit and scope of the present invention. For example, the memory array has been described as DRAM, but the principles of the present invention are capably applicable to other forms of RAM, including static-RAM (SRAM). Accordingly, many modifications may be made by one of ordinary skill without departing from the spirit and scope of the present invention, the scope of which is defined by the following claims.

What is claimed is:

1. An apparatus for providing efficient accesses to memory in a computer system, the computer system including a controller, the apparatus comprising:

a random access memory array having a plurality of rows and columns and being coupled to the controller; and a column selection mechanism coupled to the memory array and the controller, the column selection mechanism being divided into predetermined portions for providing column selection signals to access chosen portions of a row in the memory array.

2. The apparatus of claim 1 wherein the column selection mechanism comprises a multiplexer.

3. The apparatus of claim 2 wherein the multiplexer is divided into halves.

4. The apparatus of claim 3 wherein the multiplexer provides separate selection signals for accessing upper word halves and lower word halves of the random access memory.

5. The apparatus of claim 1 further comprising an incrementer, wherein the incrementer comprises a three-bit adder.

6. The apparatus of claim 5 wherein a least significant bit of an incremented address signal from the incrementer determines whether the column selection mechanism receives the incremented address signal.

7. The apparatus of claim 1 wherein the column selection mechanism is divided in half.

8. The apparatus of claim 1 wherein the column selection mechanism is divided into quarters.

9. The apparatus of claim 1 wherein the column selection mechanism is divided into eighths.

10. A method for providing efficient accesses to memory in a computer system, the computer system including a controller, the method comprising:

(a) separating a column selection mechanism into a predetermined number of portions; and (b) providing at least two column address signals to the column selection mechanism, wherein each of the column address signals is input to each of the portions of the column selection mechanism to select chosen portions of the memory.

11. The method of claim 10 wherein step (a) further comprises separating the column selection mechanism into halves.

12. The method of claim 11 wherein the chosen portions of the memory are an upper word half and a lower word haft of the memory.

13. The method of claim 10 further comprising incrementing a column address signal to provide an incremented column address signal for the at least two column address signals.

14. The method of claim 10 further comprising providing a multiplexer for the column selection mechanism.

15. The method of claim 14 wherein the multiplexer comprises an 8:1 MUX.

16. The method of claim 10 further comprising providing an incrementer coupled to the column selection mechanism.

17. The method of claim 16 wherein the incrementer comprises a three-bit adder.

18. The method of claim 16 further comprising selecting the upper half word from a different column than the lower half word based on least significant bit of an output from the incrementer.

19. A system for providing random accesses to sequential words crossing a word boundary in a memory array of a computer system, the computer system including a controller, the system comprising:

a multiplexer coupled to the controller and to the memory array, the multiplexer being divided into predetermined portions for providing separate selection signals for accessing chosen portions of the memory array; and an incrementer, the incrementer coupled to the multiplexer and the controller, the incrementer incrementing address signals received from the controller, wherein the address signals and the incremented address signals selectively determine which separate selection signals are output from the multiplexer.

20. The system of claim 19 wherein a least significant bit of the incremented address signal determines whether the incremented address signal is received by the multiplexer.

21. The system of claim 19 wherein the multiplexer comprises an 8:1 multiplexer.

22. The system of claim 19 wherein the incrementer comprises a three-bit adder.

* * * * *